United States Patent [19]
Nakamura et al.

[11] Patent Number: 5,910,216
[45] Date of Patent: Jun. 8, 1999

[54] CRYSTAL HOLDING APPARATUS

[75] Inventors: Yasushi Nakamura; Seiichiro Otsuka, both of Tomioka, Japan

[73] Assignee: Shin-Etsu Handotai Co., Ltd., Tokyo, Japan

[21] Appl. No.: 08/916,155

[22] Filed: Sep. 2, 1997

[30] Foreign Application Priority Data

Sep. 18, 1996 [JP] Japan ........................... 8-267806

[51] Int. Cl.$^6$ ................................. C30B 35/00
[52] U.S. Cl. ................ 117/218; 117/900; 117/911
[58] Field of Search ........................ 117/200, 208, 117/218, 900, 911

[56] References Cited

U.S. PATENT DOCUMENTS

| | | | |
|---|---|---|---|
| 4,190,630 | 2/1980 | Apilat et al. ........................ | 117/911 |
| 5,106,593 | 4/1992 | Mizuishi et al. ..................... | 117/218 |
| 5,126,113 | 6/1992 | Yamagishi et al. .................. | 117/911 |
| 5,582,642 | 12/1996 | Korb et al. .......................... | 117/218 |

FOREIGN PATENT DOCUMENTS

| | | |
|---|---|---|
| A-286133 | 10/1988 | European Pat. Off. . |
| A-369626 | 5/1990 | European Pat. Off. . |
| A-449260 | 10/1991 | European Pat. Off. . |
| A-781875 | 7/1997 | European Pat. Off. . |
| 362288191A | 12/1987 | Japan ........................ 117/911 |
| A-62-288191 | 12/1987 | Japan . |
| A-63-252991 | 10/1988 | Japan . |
| A-3-285893 | 12/1991 | Japan . |
| A-3-295893 | 12/1991 | Japan . |
| A-9-2893 | 1/1997 | Japan . |
| A-9-183694 | 7/1997 | Japan . |

*Primary Examiner*—Felisa Hiteshew
*Attorney, Agent, or Firm*—Oliff & Berridge, PLC

[57] ABSTRACT

In a crystal holding apparatus, a corrugated portion between a seed crystal and a straight cylindrical portion of a crystal is held by a lifting jig during a single-crystal growing process wherein the seed crystal is brought into contact with a material melt and is subsequently pulled while being rotated. The tip end portion of the lifting jig includes a swinging portion having a short stroke which swings to hold or release the corrugated portion. A lock mechanism is also provided in order to swing the swinging portion for opening/closing operation and to lock the swinging portion. Accordingly, it is possible to reliably hold the corrugated portion of a crystal while the crystal is pulled in accordance with the CZ method, for example.

16 Claims, 5 Drawing Sheets

CRYSTAL HOLDING APPARATUS

BACKGROUND OF THE INVENTION

1. Field of the Invention

The present invention relates to an improvement on a crystal holding apparatus for holding a corrugated portion of a crystal in a pulling apparatus which pulls the crystal according to the Czochralski method (CZ method), for example.

2. Description of the Related Art

With regard to manufacture of semiconductor materials such as silicon through use of a pulling apparatus operated according to CZ method, there have been proposed various techniques for pulling a crystal safely through compensation for insufficient strength of a neck portion, or a portion of the crystal to be physically held and pulled, even when a large-sized or heavier crystal is pulled. The applicant of the present invention has also proposed such a single-crystal holding apparatus in, for example, Japanese Patent Application No. 7-351275.

As shown in FIG. 6, the single-crystal holding apparatus includes a wire pulling mechanism 52 for winding up a wire 51 and a lifting-jig moving mechanism 54 for vertically moving lifting jigs 53 which hold a corrugated portion Ck of a crystal C. A seed chuck 55 which holds a seed crystal 56 is attached to the tip end of the wire 51.

Initially, the seed crystal 56 attached to the tip end of the wire 51 is brought into contact with material melt, and subsequently the wire 51 is pulled by the wire pulling mechanism 52 to thereby grow the crystal C subsequent to the seed crystal 56. When the corrugated portion Ck formed between the seed crystal 56 and a straight cylindrical portion Ct of the crystal C rises to a predetermined position, bottom chuck portions d of a pair of lifting jigs 53, which have been in the open position, move inward and chuck the corrugated portion Ck. Subsequently, in place of the wire pulling mechanism 52, the lifting-jig moving mechanism 54 is operated so as to pull the crystal C.

The pair of lifting jigs 53 are pivotally supported at their intermediate pivotal point p and thus assume a scissors-like structure. Drive means 57 connected to the upper ends of the lifting jigs 53 cause the bottom chuck portions d to open or close.

Numeral 58 denotes a lifting base, which is part of the lifting-jig moving mechanism 54. Numeral 59 denotes a ball screw for moving the lifting base 58 vertically. Numeral 60 denotes a guide bar for guiding a vertical movement of the lifting base 58. Numeral 61 denotes an expandable bellows chamber.

However, in the crystal holding apparatus described above, the distance between the intermediate pivotal point p and a point of action (the tip end of the chuck portion d) is longer than that between a point of force generation (the drive means 57) and the intermediate pivotal point p. As a result, a small amount of play at the point of force generation (the drive means 57) becomes a large amount of play at the point of application (the tip end of the chuck portion d). This hinders a smooth switching from the wire pulling mechanism 52 to the lifting-jig moving mechanism 54.

Also, since the distance between the intermediate pivotal point p and the point of application (the tip end of the chuck portion d) is long, the lifting jig 53 easily deflects (deforms) due to a large load acting thereon or other causes. In this case, the chucking force decreases, so that a crystal slips out of position, resulting in a failure to grow a crystal having intended properties.

In the crystal pulling apparatus of FIG. 6, when the grown crystal C is to be unloaded therefrom, the bellows chamber 61 is contracted upward to expose the crystal C. In this case, since the ball screw 59 and the guide bar 60 are arranged around the bellows chamber 61, they may obstruct the removal of the crystal C from the crystal pulling apparatus.

Further, in a crystal pulling method wherein the bellows chamber 61 forms a vacuum chamber, an increase in the size of a bellows chamber associated with a recent tendency to increase the size of crystals requires the bellows chamber to have a sufficiently large strength against established vacuum and a large-sized drive to be provided for expanding/contracting the bellows chamber, involving difficult problems to solve.

Basically, the use of a bellows chamber is highly likely to involve a contamination of impurities caught in bellows into a crystal being grown, an insufficient degree of vacuum, turbulence in a flow of an inert gas, and other problems. Therefore, if possible, it is preferable that no bellows structure be employed.

Accordingly, in a crystal holding apparatus which holds a corrugated portion of a crystal by a lifting jig to thereby pull a crystal, there has been demand for a crystal holding apparatus capable of holding the corrugated portion reliably and without the occurrence of any play or displacement (variation in position stemming from slippage; the term "displaced" used hereinbelow has the same meaning) of a chucking position even when a relatively heavy load is imposed thereon.

In the case of a crystal pulling apparatus which employs a bellows chamber, it is preferable to employ a structure such that obstacles are not disposed around an area through which a grown crystal is taken out of the chamber.

Further, if possible, a crystal pulling apparatus preferably does not employ a bellows chamber itself.

SUMMARY OF THE INVENTION

An object of the present invention is to provide an improved crystal holding apparatus which can reliably hold the corrugated portion of a crystal while the crystal is pulled in accordance with the CZ method, for example.

In order to achieve the above object, the present invention provides a crystal holding apparatus in which a corrugated portion between a seed crystal and a straight cylindrical portion of a crystal is held by a lifting jig during a single-crystal growing process wherein the seed crystal is brought into contact with material melt and is subsequently pulled while being rotated. In the crystal holding apparatus, a tip end portion of the lifting jig is composed of a swinging portion having a short stroke which swings to hold or release the corrugated portion, and a lock mechanism is provided in order to swing the swinging portion for opening/closing operation and to lock the swinging portion.

Since the swinging portion formed at the tip end portion of the lifting jig and having a short stroke is used to hold the corrugated portion of a crystal, the swinging portion is less likely to deflect (deform) even when a relatively heavy load is imposed on the corrugated portion. Thus, a chucking position is not displaced. Also, there does not arise a problem that play at a pivotal point is amplified at the point of application (a tip end of a chuck portion). Accordingly, a crystal is accurately held at a corrugated portion thereof.

Preferably, means for pulling the crystal comprises a wire pulling mechanism for pulling upward a seed chuck used for holding a seed crystal and a lifting-jig moving mechanism constructed integrally with the wire pulling mechanism and used for vertically moving the lifting jig. When the lifting jig chucks the corrugated portion during a pulling operation by the wire pulling mechanism, instead of the wire pulling mechanism, the lifting-jig moving mechanism is operated to continue the pulling operation in order to grow the crystal.

Providing the swinging portion at the tip end portion of the lifting jig is particularly effective for a crystal pulling apparatus wherein pulling of a crystal by a wire is switched to pulling by the lifting jig at a certain point of a pulling process. The swinging portion of the lifting jig holds the crystal at its corrugated portion accurately and reliably, so that pulling by a wire can be smoothly shifted to pulling by the lifting jig.

Preferably, means for holding the crystal comprises an outer rotary tube and an inner rotary tube which constitute a double-tube structure and which can move vertically relative to the other, the lifting jig being attached to the outer rotary tube, and the lock mechanism being attached to the inner rotary tube.

A pulling wire runs through the inner rotary tube, for example. The swinging portion of the lifting jig attached to the outer rotary tube holds the corrugated portion of a crystal being pulled by the wire. Also, the inner rotary tube and the outer rotary tube are moved vertically relative to each other to thereby lock the swinging portion.

Preferably, the lock mechanism comprises a cap-like member capable of enclosing the outer surface of the swinging portion of the lifting jig. The cap-like member is moved upward or downward in order to hold the outer surface of the swinging portion for the purpose of locking the swinging portion and is moved in the opposite direction in order to release the swinging portion for the purpose of opening the swinging portion.

The cap-like member serving as the lock mechanism is moved relative to the lifting jig to thereby establish mechanical lock, so that even a relatively heavy crystal can be reliably held.

Preferably, the lifting-jig moving mechanism is disposed at the rear of a crystal pulling apparatus to thereby provide obstacle-free space in front of and to either side of the crystal pulling apparatus.

Since no obstacles are present in front of and to either side of the crystal pulling apparatus, a grown crystal can be smoothly removed from the crystal pulling apparatus.

Preferably, the wire pulling mechanism and the lifting-jig moving mechanism are provided above an upper vacuum chamber of a crystal pulling apparatus.

Since the crystal pulling means is located above the upper vacuum chamber, it becomes unnecessary for the upper vacuum chamber to employ a bellows structure. Thus, the aforementioned problems such as entry of impurities into a crystal being grown, and an inefficient degree of vacuum can be solved, and the upper vacuum chamber structure becomes rigid and simple. Further, demand for crystals having relatively large sizes can be readily dealt with.

In this connection, if in the conventional crystal holding apparatus of FIG. 6, an attempt is made to locate the wire pulling mechanism 52, the lifting base 58, etc. above the upper vacuum chamber, the stroke of the lifting jig 53 must be further increased, resulting in a potential failure to accurately hold the corrugated portion of a crystal. By contrast, the crystal holding apparatus of the present invention does not raise such a problem since the swinging portion having a short stroke is provided at the tip end portion of the lifting jig.

DESCRIPTION OF THE PREFERRED EMBODIMENTS

Embodiments of the present invention will now be described with reference to the drawings.

A crystal holding apparatus of the present invention is applied to a crystal pulling apparatus which grows a single crystal of a semiconductor material such as silicon by the so-called Czochralski method (CZ method), and is particularly adapted to pull a relatively heavy single crystal safely and without generation of dislocations.

Figure 1:
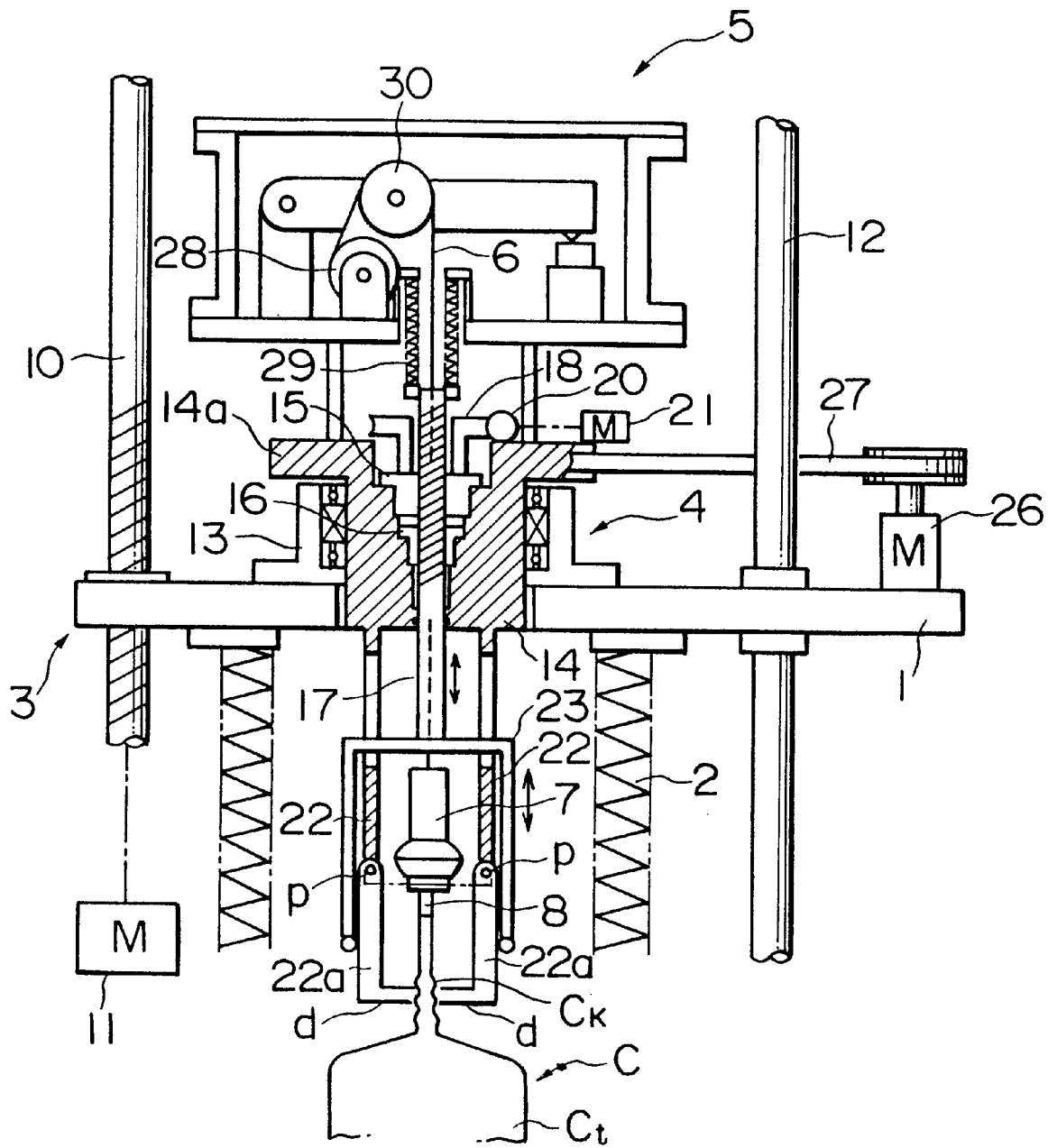
FIG. 1 is a view showing a main portion of a first embodiment of a crystal pulling apparatus to which a crystal holding apparatus of the present invention is applied.

As shown in FIG. 1, such a crystal pulling apparatus includes an unillustrated lower chamber which contains an unillustrated crucible, a lifting base 1 disposed above the lower chamber with a predetermined clearance present therebetween, and a bellows chamber 2 disposed between the lifting base 1 and the lower chamber. The lifting base 1 is vertically moved by a lifting-jig moving mechanism 3. A crystal holding mechanism 4 is provided on the lifting base 1.

A wire pulling mechanism 5 is provided above the crystal holding mechanism 4. A seed crystal 8 held by a seed chuck 7 attached to the lower end of a wire 6 is pulled upward at a constant speed to thereby grow a crystal C subsequent to the seed crystal 8.

The lifting-jig moving mechanism 3 includes a ball screw 10 screw-engaged with the lifting base 1, a drive motor 11 for driving the ball screw 10 rotatively, and a guide bar 12 for guiding the lifting base 1 which moves vertically. The drive motor 11 causes the lifting base 1 to move vertically.

The crystal holding mechanism 4 includes a magnetic seal 13 mounted on the lifting base 1, an outer rotary tube 14 mounted rotatably to the magnetic seal 13 via a bearing, a ball screw nut 15 provided rotatably in the outer rotary tube 14, a ball spline nut 16, and an inner rotary tube 17 which is externally threaded to thereby be screw-engaged with the ball screw nut 15. A worm wheel 18 is integrally attached to the top portion of the ball screw nut 15. The worm wheel 18 is in screw-engagement with a worm gear 20, which is driven by a motor 21.

Accordingly, when the motor 21 causes the worm gear 20 to rotate, the rotation of the worm gear 20 is transmitted to the ball screw nut 15. As a result, the inner rotary tube 17 screw-engaged with the ball screw nut 15 moves vertically relative to the outer rotary tube 14.

A pair of lifting jigs 22 extend downward in parallel with each other from the lower end portion of the outer rotary tube 14. The lower end portions of the lifting jigs 22 are composed of swinging portions 22a which have a relatively short stroke and are swingable about pivotal points p. The lower end portions of the swinging portions 22a are bent inward to form chuck portions d.

A cap-like member 23 serving as a lock mechanism is attached to the lower end portion of the inner rotary tube 17. The cap-like member 23 has a cylindrical shape capable of enclosing the outer surfaces of the swinging portions 22a. The cap-like member 23 is designed to be able to move vertically without interfering with the lifting jigs 22, thereby swinging the swinging portions 22a in the locking direction or the releasing direction.

Figure 2A:
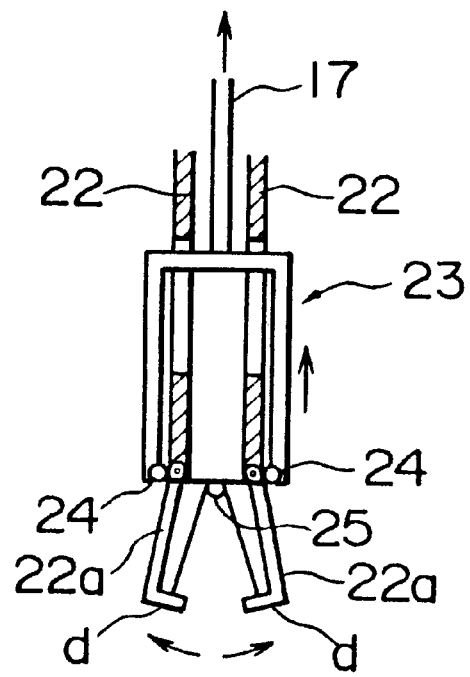
FIG. 2A is a view showing a lock mechanism in an unlocking position.
Figure 2B:
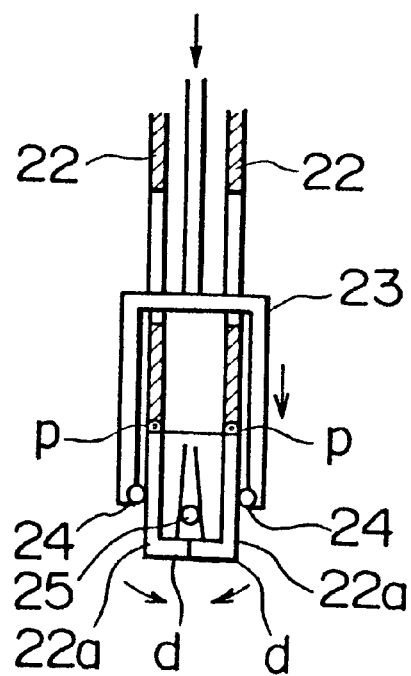
FIG. 2B is a view showing the lock mechanism in a locking position.

That is, as shown in FIGS. 2A and 2B, rollers 24 are attached to the lower end portion of the cap-like member 23 so as to press the outer surfaces of the swinging portions 22a. Also, a guide pin 25 is provided at the central bottom portion of the cap-like member 23 such that it is inserted between the pair of swinging portions 22a. Further, the inner surfaces of the swinging portions 22a are tapered such that an upper clearance therebetween becomes narrower than the lower one.

Accordingly, as shown in FIG. 2A, when the cap-like member 23 rises relative to the lifting jigs 22, the guide pin 25 causes the swinging portions 22a to swing in the opening direction. By contrast, as shown in FIG. 2B, when the cap-like member 23 lowers relative to the lifting jigs 22, the rollers 24 press the outer surfaces of the swinging portions 22a, so that the swinging portions 22a swings in the closing direction and is locked.

As shown in FIG. 1, at the upper portion of the outer rotary tube 14, there is formed a pulley portion 14a, around which a belt 27 is wound so as to transmit a driving force of a motor 26 to the outer rotary tube 14. In the wire pulling mechanism 5, the wire 6 wound on a take-up pulley 28 extends downward via a guide pulley 30 and runs through the inner rotary tube 17 down to an intermediate portion between the lifting jigs 22.

A bellows 29 is provided between the upper end of the inner rotary tube 17 and a frame of the wire pulling mechanism 5.

Operation of a crystal pulling apparatus having the above-described structure will now be described.

First, the seed crystal 8 attached to the lower end of the wire 6 is brought into contact with material melt contained in a crucible. Subsequently, the wire 6 is pulled upward by the wire pulling mechanism 5 so that the crystal C, which is composed of a neck portion and a straight cylindrical portion Ct, grows subsequent to the seed crystal 8. In this case, when a corrugated portion Ck formed between the seed crystal 8 and the straight cylindrical portion Ct rises to a predetermined position, the motor 21 starts operating so as to lower the inner rotary tube 17 relative to the outer rotary tube 14, thereby lowering the cap-like member 23 from the position of FIG. 2A to the position of FIG. 2B. As a result, the swinging portions 22a are swung in the closing direction to thereby hold the corrugated portion Ck by the chuck portions d. At the same time, the rollers 24 press the outer surfaces of the swinging portions 22a to thereby lock the swinging portions 22a.

When the corrugated portion Ck is held by the swinging portions 22a, the wire pulling mechanism 5 stops pulling the crystal C, and the lifting-jig moving mechanism 3 takes over the pulling operation.

That is, the drive motor 11 is started so as to rotate the ball screw 10, so that the lifting base 1 begins to rise.

Since the distance between the pivotal points p of the swinging portions 22a and the chuck portions d is relatively short and a stroke of the swinging portions 22a is also relatively short, the swinging portions 22a are less likely to deform, so that the corrugated portion Ck is reliably held. Also, since the cap-like member 23 reliably locks the swinging portions 22a, the position of chuck is not displaced even in the case of pulling a relatively heavy crystal.

Figure 3:
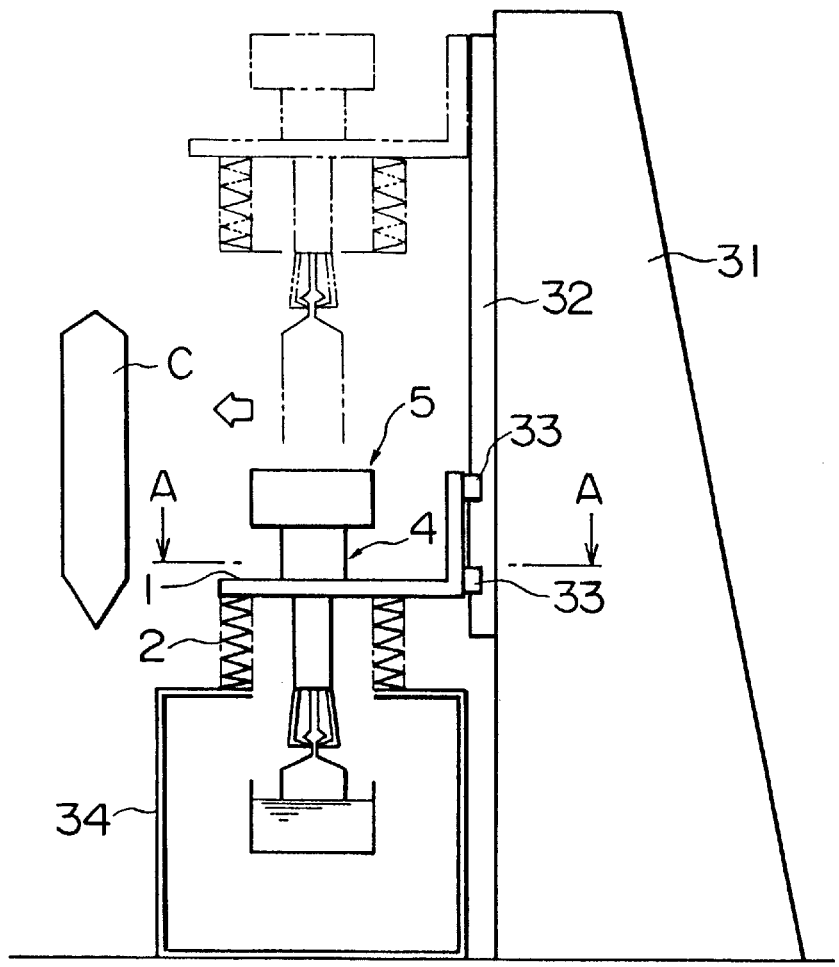
FIG. 3 is a side view showing a second embodiment of a crystal pulling apparatus to which the crystal holding apparatus of the present invention is applied.
Figure 4:
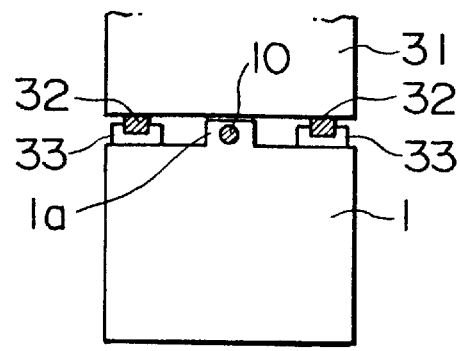
FIG. 4 is a sectional view taken along line A—A of FIG. 3.

Next, a second embodiment of a crystal pulling apparatus will be described with reference to FIGS. 3 and 4. In FIGS. 3 and 4, the same members and features as those of FIG. 1 are denoted by common reference numerals.

In this crystal pulling apparatus of the second embodiment, the wire pulling mechanism 5 and the crystal holding mechanism 4 have substantially the same structures as those of the first embodiment, whereas the structure of the lifting-jig moving mechanism 3 is modified so as to provide obstacle-free space in front of and to either side of the crystal pulling apparatus, thereby facilitating removal of the grown crystal C from the apparatus.

Specifically, a rear frame 31 stands at the rear of the crystal pulling apparatus. A pair of right and left linear rails 32 are mounted on the front surface of the rear frame 31 such that they extend in a vertical direction. Linear guides 33 attached to the base end portion of the lifting base 1 are slidably engaged with the linear rails 32. A screw-engagement portion 1a is attached to the base end portion of the lifting base 1 to be located at a laterally intermediate position. The ball screw 10 is screw-engaged with the screw-engagement portion 1a.

The ball screw 10 is rotated to thereby move the lifting base 1 vertically. As mentioned above, the crystal holding mechanism 4 provided on the lifting base 1 and the wire pulling mechanism 5 have the same structures as those of the first embodiment.

In this crystal pulling apparatus of the second embodiment, when pulling the crystal C is completed as represented by a two-dot-and-dash line in FIG. 3, the lower end portion of the bellows chamber 2 is disconnected from a lower chamber 34. The bellows chamber 2 is contracted upward to thereby expose the crystal C.

The bellows chamber 2 is formed of, for example, a metallic bellows member. When a crystal is to be grown, the lower end portion of the bellows chamber 2 is connected to the lower chamber 34 to thereby form a vacuum chamber. As the lifting base 1 rises, the bellows chamber 2 expands while internal vacuum is maintained. On completion of pulling the crystal C, the bellows chamber 2 is disconnected from the lower chamber 34 to thereby expose the crystal C.

In contrast with the first embodiment wherein the ball screw 10 and the guide bar 12 may somewhat interfere with the crystal C at the time of removal thereof, there are not such obstacles, so that the crystal C can be smoothly removed from the crystal pulling apparatus.

Figure 5:
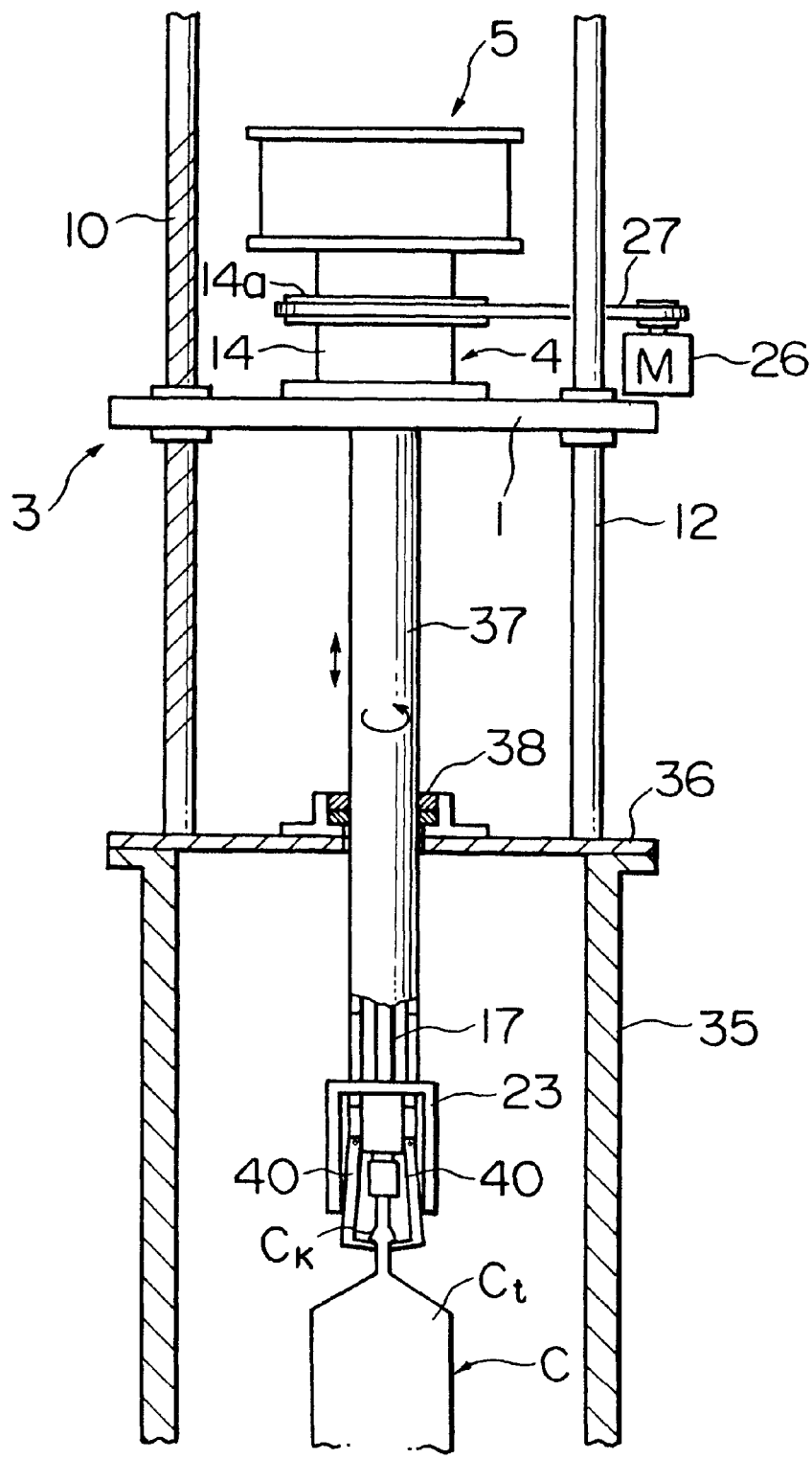
FIG. 5 is a view showing a main portion of a third embodiment of a crystal pulling apparatus to which the crystal holding apparatus of the present invention is applied.
Figure 6:
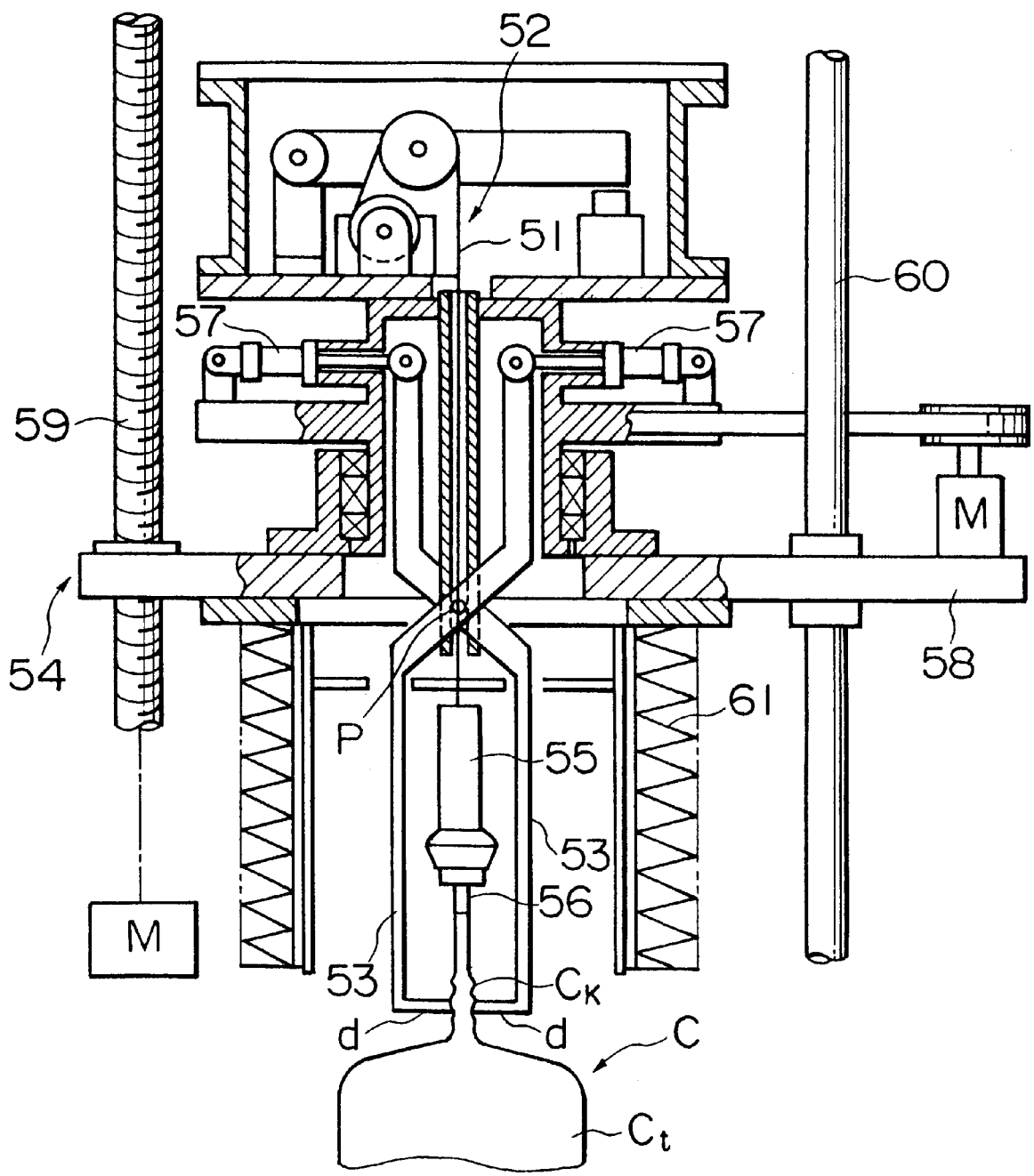
FIG. 6 is a view showing a main portion of a crystal pulling apparatus to which a conventional crystal holding apparatus is applied.

Next, a third embodiment of a crystal pulling apparatus will be described with reference to FIG. 5. In FIG. 5, the same members and features as those of the preceding embodiments are denoted by common reference numerals.

In this crystal pulling apparatus of the third embodiment, the bellows chamber 2 is not employed, thereby simplifying the structure of the apparatus and solving problems associated with a bellows chamber such as entry of impurities into a crystal being grown, an inefficient degree of vacuum, and a disturbance of a flow of an inert gas.

Specifically, an upper vacuum chamber 35 having a rigid structure is provided in place of the bellows chamber 2. The lifting-jig moving mechanism 3 and the wire pulling mechanism 5 are disposed above the upper vacuum chamber 35.

The lifting base 1 screw-engaged with the ball screw 10 and the guide bar 12 are mounted on an upper plate 36 of the upper vacuum chamber 35. A lifting tube 37 serving as a lifting jig is attached to the lower end portion of the outer rotary tube 14 of the crystal holding mechanism 4 and extends downward through a through-hole in the upper plate 36. The through-hole portion is sealed with an oil seal 38.

A pair of swinging members 40 serving as swinging portions are provided at the lower end portion of the lifting tube 37. The cap-like member 23 attached to the lower end of the inner rotary tube 17 is moved vertically along the outer surfaces of the swinging members 40, thereby locking or releasing the swinging members 40. Details of this lock mechanism and the structures of the crystal holding mechanism 4 and the wire pulling mechanism 5 are similar to those of the preceding embodiments.

In this crystal pulling apparatus of the third embodiment, the lifting tube 37 becomes relatively long. However, since the swinging members 40 which hold the corrugated portion Ck of the crystal C are short in stroke, the amount of holding error caused by deflection (deformation) is relatively small. Further, the cap-like member 23 reliably locks the swinging members 40, so that the position of chuck is not displaced.

Further, since the upper vacuum chamber 35 is rigid, an increase in the size of the crystal C is readily coped with, and the aforementioned problems associated with the employment of the bellows chambers 2 can be avoided.

The present invention is not limited to the above-described embodiments. The above-described embodiments are mere examples, and those having the substantially same structure as that described in the appended claims and providing the similar action and effects are included in the scope of the present invention.

What is claimed is:

1. A crystal holding apparatus for holding a corrugated portion between a seed crystal and a straight cylindrical portion of a crystal during a single-crystal growing process wherein the seed crystal is brought into contact with a material melt of a material and is subsequently pulled while being rotated, said crystal holding apparatus comprising:

a lifting jig for holding the corrugated portion of the crystal;

a swinging portion provided at a tip end portion of said lifting jig, said swinging portion having a short stroke and being adapted to swing so as to hold or to release the corrugated portion during pulling of the crystal; and a lock mechanism which swings the swinging portion for opening and closing operation of the swinging portion and which locks the swinging portion.

2. A crystal holding apparatus according to claim 1, comprising means for pulling the crystal including a wire pulling mechanism for pulling upward a seed chuck for holding the seed crystal and a lifting-jig moving mechanism constructed integrally with said wire pulling mechanism for vertically moving said lifting jig; and when said lifting jig chucks the corrugated portion of the crystal during a pulling operation by said wire pulling mechanism, instead of said wire pulling mechanism, said lifting-jig moving mechanism is operated to continue the pulling operation in order to grow the crystal.

3. A crystal holding apparatus according to claim 2, comprising means for holding the crystal including an outer rotary tube and an inner rotary tube which constitute a double tube structure and which can move vertically relative to each other; said lifting jig is attached to said outer rotary tube; and said lock mechanism is provided on said inner rotary tube.

4. A crystal holding apparatus according to claim 3, wherein said lock mechanism comprises a cap-like member that can enclose the outer surface of the swinging portion of said lifting jig; said cap-like member is moved in an upward or downward direction so as to hold the outer surface of the swinging portion for locking the swinging portion; and said cap-like member is moved in the opposite direction to release the swinging portion for opening the swinging portion.

5. A crystal holding apparatus according to claim 4, wherein said lifting-jig moving mechanism is disposed at the rear of a crystal pulling apparatus to thereby provide obstacle-free space in front of and to either side of the crystal pulling apparatus.

6. A crystal holding apparatus according to claim 5, wherein said wire pulling mechanism and said lifting-jig moving mechanism are provided above an upper vacuum chamber of a crystal pulling apparatus.

7. A crystal holding apparatus according to claim 4, wherein said wire pulling mechanism and said lifting-jig moving mechanism are provided above an upper vacuum chamber of a crystal pulling apparatus.

8. A crystal holding apparatus according to claim 3, wherein said lifting-jig moving mechanism is disposed at the rear of a crystal pulling apparatus to thereby provide obstacle-free space in front of and to either side of the crystal pulling apparatus.

9. A crystal holding apparatus according to claim 8, wherein said wire pulling mechanism and said lifting-jig moving mechanism are provided above an upper vacuum chamber of a crystal pulling apparatus.

10. A crystal holding apparatus according to claim 3, wherein said wire pulling mechanism and said lifting-jig moving mechanism are provided above an upper vacuum chamber of a crystal pulling apparatus.

11. A crystal holding apparatus according to claim 2, wherein said lifting-jig moving mechanism is disposed at the rear of a crystal pulling apparatus to thereby provide obstacle-free space in front of and to either side of the crystal pulling apparatus.

12. A crystal holding apparatus according to claim 11, wherein said wire pulling mechanism and said lifting-jig moving mechanism are provided above an upper vacuum chamber of a crystal pulling apparatus.

13. A crystal holding apparatus according to claim 2, wherein said wire pulling mechanism and said lifting-jig moving mechanism are provided above an upper vacuum chamber of a crystal pulling apparatus.

14. A crystal holding apparatus according to claim 1, comprising means for holding the crystal including an outer rotary tube and an inner rotary tube which constitute a double tube structure and which can move vertically relative to each other; said lifting jig is attached to said outer rotary tube; and said lock mechanism is provided on said inner rotary tube.

15. A crystal holding apparatus according to claim 14, wherein said lock mechanism comprises a cap-like member that can enclose the outer surface of the swinging portion of said lifting jig; said cap-like member is moved in an upward or downward direction so as to hold the outer surface of the swinging portion for locking the swinging portion; and said cap-like member is moved in the opposite direction to release the swinging portion for opening the swinging portion.

16. A crystal holding apparatus for holding a corrugated portion between a seed crystal and a straight cylindrical portion of a crystal during a single-crystal growing process wherein the seed crystal is brought into contact with a material melt of a material and is subsequently pulled while being rotated, the crystal holding apparatus comprising:

a lifting jig for holding the corrugated portion of the crystal;

a swinging portion pivotally attached at a bottom end portion of the lifting jig, the swinging portion having a short stroke and being adapted to swing between closed and open positions so as to respectively hold or release the corrugated portion during pulling of the crystal; and a lock mechanism which can selectively swing the swinging portion to open or to close the swinging portion during pulling of the crystal and can lock the swinging portion in a closed condition.

\* \* \* \* \*